(12) United States Patent
Wagner

(10) Patent No.: US 8,946,098 B2
(45) Date of Patent: Feb. 3, 2015

(54) DEVICE FOR A LASER LIFT-OFF METHOD AND LASER LIFT-OFF METHOD

(75) Inventor: Ralph Wagner, Neutraubling (DE)

(73) Assignee: OSRAM Opto Semiconductors GmbH (DE)

(*) Notice: Subject to any disclaimer, the term of this patent is extended or adjusted under 35 U.S.C. 154(b) by 365 days.

(21) Appl. No.: 13/514,373

(22) PCT Filed: Oct. 21, 2010

(86) PCT No.: PCT/EP2010/065891
§ 371 (c)(1),
(2), (4) Date: Jun. 28, 2012

(87) PCT Pub. No.: WO2011/069735
PCT Pub. Date: Jun. 16, 2011

(65) Prior Publication Data
US 2012/0258605 A1    Oct. 11, 2012

(30) Foreign Application Priority Data

Dec. 9, 2009 (DE) .......................... 10 2009 057 566

(51) Int. Cl.
| | |
|---|---|
| H01L 21/26 | (2006.01) |
| H01L 21/324 | (2006.01) |
| H01L 21/42 | (2006.01) |
| H01L 21/477 | (2006.01) |
| B23K 26/06 | (2014.01) |

(Continued)

(52) U.S. Cl.
CPC ......... B23K 26/0608 (2013.01); B23K 26/0635 (2013.01); B23K 26/067 (2013.01); B23K 26/0736 (2013.01); B23K 26/362 (2013.01); B23K 26/4075 (2013.01); B23K 26/0063 (2013.01); B23K 2201/40 (2013.01); H01K 33/0079 (2013.01)

USPC ............ 438/795; 438/796; 438/458; 438/487

(58) Field of Classification Search
USPC .................................. 438/795, 796, 458, 487
See application file for complete search history.

(56) References Cited

U.S. PATENT DOCUMENTS

| | | |
|---|---|---|
| 5,678,560 A | 10/1997 | Sakamoto et al. |
| 5,786,560 A | 7/1998 | Tatah et al. |
| 6,169,631 B1 | 1/2001 | Xuan et al. |
| 6,210,479 B1 | 4/2001 | Bojarczuk |
| 2006/0246687 A1 | 11/2006 | Kaiser et al. |
| 2006/0246693 A1 | 11/2006 | Tanaka |

FOREIGN PATENT DOCUMENTS

| | | |
|---|---|---|
| CN | 2432001 | 5/2001 |
| CN | 101434005 A | 5/2009 |

(Continued)

OTHER PUBLICATIONS

Examination Report issued in corresponding Taiwanese Patent Application No. 099140137 dated Oct. 4, 2013.

(Continued)

*Primary Examiner* — Thien F Tran
(74) *Attorney, Agent, or Firm* — DLA Piper LLP (US)

(57) ABSTRACT

A device is intended for a laser lift-off method to sever at least one layer from a carrier. The device includes a laser that generates pulsed laser radiation and at least one beam splitter. The laser radiation is divided into at least two partial beams by the at least one beam splitter. The partial beams are superimposed in an irradiation plane, the irradiation plane being provided such that a major side of the carrier remote from the layer is arranged therein. At the irradiation plane, an angle ($\alpha$) between the at least two partial beams is at least 1.0°.

12 Claims, 3 Drawing Sheets

(51) Int. Cl.
*B23K 26/067* (2006.01)
*B23K 26/073* (2006.01)
*B23K 26/36* (2014.01)
*B23K 26/40* (2014.01)
*B23K 26/00* (2014.01)

(56) References Cited

FOREIGN PATENT DOCUMENTS

| EP | 0 859 261 | 2/1997 |
|---|---|---|
| JP | 2005-516415 A | 6/2005 |
| JP | 2005-224827 A | 8/2005 |
| TW | I247368 | 1/2006 |
| WO | 2008/151039 | 12/2008 |

OTHER PUBLICATIONS

An English translation of the Chinese Examination Report dated Dec. 25, 2013 for Chinese Application No. 201080055854.

An English translation of the Japanese Notification of Reasons for Refusal dispatched May 7, 2014 from corresponding Japanese Patent Application No. 2012-542414.

L. Tsakalakos et al., "Epitaxial ferroelectric (Pb, La)(Zr, Ti)O$_3$ thin films on stainless steel by excimer laser liftoff," *Applied Physics Letters*, vol. 76, No. 2, 2000, pp. 227-229.

Notice of Allowance for corresponding Japanese Patent Application No. 2012-542414 dated Oct. 6, 2014.

A)

DEVICE FOR A LASER LIFT-OFF METHOD AND LASER LIFT-OFF METHOD

RELATED APPLICATIONS

This is a §371 of International Application No. PCT/EP2010/065891, with an international filing date of Oct. 21, 2010, which is based on German Patent Application No. 10 2009 057 566.9, filed Dec. 9, 2009, the subject matter of which is incorporated by reference.

TECHNICAL FIELD

This disclosure relates to a device for a laser lift-off method and a laser lift-off method.

BACKGROUND

It could be helpful to provide a device for a laser lift-off method with which a layer may be severed efficiently and reliably from a carrier. In particular, it could be helpful to provide a laser lift-off method in which a semiconductor layer sequence may be reliably removed from a carrier.

SUMMARY

I provide a device for a laser lift-off method for severing at least one layer from a carrier including a laser that generates laser radiation and at least one beam splitter, wherein the laser radiation is divided into at least two partial beams by the at least one beam splitter, the at least two partial beams are superimposed in an irradiation plane, the irradiation plane is provided such that a major side of the carrier remote from the layer is arranged therein, and an angle between the at least two partial beams at the irradiation plane amounts to at least 1.0°.

I also provide a laser lift-off method for severing an epitaxially grown semiconductor layer sequence from a carrier, including providing a semiconductor layer or the semiconductor layer sequence grown epitaxially on the carrier, dividing laser radiation into at least two partial beams; and superimposing the partial beams in an irradiation plane in which a major side of the carrier remote from the semiconductor layer sequence is located, wherein an angle between the at least two partial beams at the irradiation plane is at least 1.0°.

I further provide a laser lift-off method for severing an epitaxially grown semiconductor layer sequence from a carrier, comprising providing a semiconductor layer or the semiconductor layer sequence grown epitaxially on the carrier, dividing laser radiation into at least two partial beams, and superimposing the partial beams in an irradiation plane in which a major side of the carrier remote from the semiconductor layer sequence is located, wherein an angle between the at least two partial beams at the irradiation plane is 7.5° to 50° and an angle between the partial beams and a perpendicular of the irradiation plane is 0° to 30°, the laser radiation is pulsed laser radiation and a pulse duration of the laser radiation is at most 50 ns, an optical path length difference between the partial beams corresponds to at least 0.025 times and at most 0.25 times the pulse duration, and an average roughness of the major side of the carrier remote from the semiconductor layer sequence is 0.1 µm to 5.0 µm.

DETAILED DESCRIPTION

Figure 1:
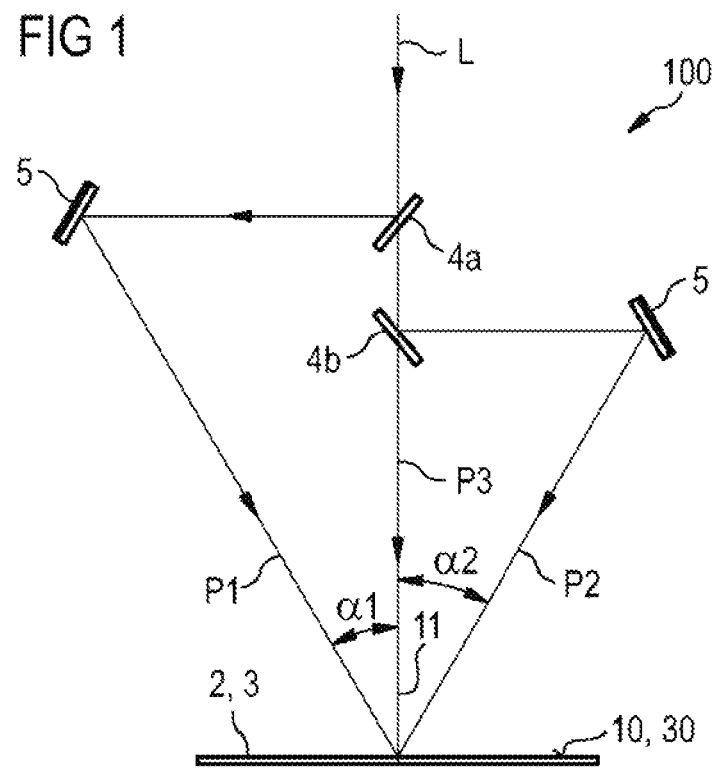
FIGS. 1, 2, 4, 7 and 8 show schematic examples of devices described herein with which a laser lift-off method described herein may be performed.

My device is suitable for a laser lift-off method, in particular for severing a semiconductor layer or semiconductor layer sequence grown epitaxially on an epitaxial substrate. The layer or the semiconductor layer is preferably based on a nitride-containing or oxide-containing material, in particular a nitride-containing semiconductor material. For example the semiconductor layer sequence is based on GaN, InGaN and/or AlGaN.

The device may comprise a laser for generating preferably pulsed laser radiation. The wavelength of the laser radiation is for example accordingly short-wave such that the photon energy is greater than the band gap of the semiconductor material which is to be severed from the carrier. For example, the wavelength of the laser radiation lies in the ultraviolet spectral range, in particular at wavelengths of less than 400 nm or less than 360 nm.

The device may comprise at least one beam splitter, preferably at least two beam splitters. The at least one beam splitter is set up to divide the pulsed laser radiation generated by the laser into at least two partial beams. The beam splitters may be dielectric, partially transmissive beam splitters or mirrors, or just as easily prisms and/or polarization-dependent reflective elements. That is to say, when the device is in operation, the laser radiation is divided into at least two partial beams by the at least one beam splitter.

The at least two partial beams may be superimposed in an irradiation plane. In other words, the laser radiation is divided into a plurality of partial beams and then caused to overlap again in the irradiation plane. The fact that the partial beams overlap in the irradiation plane may mean that cross-sections of the partial beams are partially or completely coincident in the irradiation plane. Coincident may include one of the cross-sections being completely surrounded or covered by another one of the cross-sections.

The irradiation plane may be provided such that a major side of the carrier remote from the layer to be severed from the carrier is arranged therein. The device may to this end comprise a holder with which the carrier with the layer may be held. The holder is preferably laterally positionable and displaceable.

An angle between the at least two partial beams at the irradiation plane may be at least 1.0°. The angle is preferably at least 5.0°. In other words, beam axes of the partial beams intersect the irradiation plane such that an angle between the beam axes of the partial beams, in particular in pairs, is at least 1.0°, preferably at least 5.0°.

The device may be intended for a laser lift-off method for severing at least one layer from a carrier. The device includes a laser for generating for example pulsed laser radiation and at least one beam splitter. The laser radiation is divided into at least two partial beams by the at least one beam splitter. The partial beams are superimposed in an irradiation plane, the irradiation plane being such that a major side of the carrier remote from the layer is arranged therein. At the irradiation plane an angle between the at least two partial beams is at least 1.0°.

If coherent, directed laser radiation is used for a laser lift-off method, on passage through an in particular rough entry face for instance of a carrier an interference pattern may arise at a boundary surface located for example a few hundred micrometers therebelow. This interference pattern comprises randomly distributed, stationary intensity modulations of the laser beam passing through. However, damage may occur to the epitaxially grown semiconductor layer sequence during laser lift-off due to the interference-capable laser radiation when using a relatively inexpensive carrier with an unpolished, rough entry face. To ensure uniform severing for example of the semiconductor layer sequence from the carrier, I discovered that it is advantageous to avoid or reduce such intensity modulations.

By division of the laser radiation into at least two partial beams and subsequent superimposition of the partial beams at a given angle, which is greater than a critical angle, the interference capability of the laser radiation may be reduced, whereby intensity modulations of an interference pattern may be reduced and damage to the semiconductor layer sequence may be avoided or reduced.

At least two of the partial beams and/or all of the partial beams may exhibit the same intensities with a tolerance of at most 20%, in particular with a tolerance of at most 10%. In other words, both and/or all of the partial beams comprise substantially the same energy per laser pulse. As the number of partial beams increases, the energy tolerance per pulse may also become greater, however. For example, the pulse energy tolerance may increase by 5 percentage points per additional partial beam, the tolerance amounting to at most 50%, however.

The pulse duration of the laser radiation may at most be 50 ns. For example, the laser radiation may consist of nanosecond pulses with pulse durations of 1 ns to 15 ns, in particular 3 ns to 10 ns. It is likewise possible for picosecond pulses or femtosecond pulses to be used, in particular with pulse durations of 2 fs to 1000 ps or with pulse durations of 60 fs to 20 ps.

An optical path length difference between the partial beams may be at most 0.05 times or at most 0.15 times, in particular at most 0.025 times the average pulse duration of the laser radiation. In other words, the light pulses of the partial beams are set up to impinge substantially simultaneously on the carrier. Preferably, the path length difference is at most of such a magnitude that at least 80% or at least 90% of the total of the energies per pulse of all the partial beams arrive at the irradiation plane in a time window of a length of at most 1.22 times or 1.15 times the average pulse duration, preferably of at most the average pulse duration. The pulse duration is preferably related to a drop in intensity to 1/e of a maximum intensity of the time profile of the pulses.

An optical path length difference between the partial beams may correspond to at least 0.025 times and at most 0.3 times the average pulse duration of the laser radiation. In other words, the light pulses of the partial beams arrive at the irradiation plane at slightly different times.

A path length difference between the partial beams may correspond to at most 0.22 times or 0.15 times the average beam diameter of the partial beams. The beam diameter is related in particular to a drop in the spatial, lateral intensity distribution to $1/e^2$ of the maximum intensity of the beam profile.

An angle between the partial beams, preferably in pairs, may in each case be 7.5° to 50°. Alternatively or in addition, an angle between the partial beams and a perpendicular to the irradiation plane is in each case 0° to 80°, in particular 0° to 30°.

The laser radiation may be divided into N partial beams and the device comprises N−1 beam splitters. In this case N is an integer, preferably 3 to 8. For a reflectivity R of the Nth beam splitter, the following relationship applies:

$$R(N)=1/(N+1)$$

The beam splitter with the highest reflectivity is here located, relative to a beam path of the laser radiation or the partial beams, closest to the irradiation plane, the beam splitter with the second highest reflectivity is in the second closest position to the irradiation plane and so on.

No optical component intended for radiation transmission may be located in the beam paths of the partial radiation between the respective, associated beam splitter and the irradiation plane. Preferably, therefore, no lens or polarization optics is/are located in the beam paths of the partial beams. In other words, the partial beams preferably do not pass through any more condensed matter en route from the associated beam splitter to the irradiation plane.

The partial beams in each case may exhibit the same cross-sectional areas and/or the same lateral dimensions in the irradiation plane, with a tolerance of at most 15%, in particular with a tolerance of at most 10%. In other words, the cross-sections of the partial beams in the irradiation plane are substantially of equal size and substantially identically shaped.

The total of the energy densities of all the partial beams in the irradiation plane may be 200 mJ/cm² to 850 mJ/cm² per laser radiation pulse.

Furthermore, a laser lift-off method is provided for severing an epitaxially grown semiconductor layer sequence from a carrier, in particular from a growth substrate. The lift-off method may be carried out with a device as described in relation to at least one of the above-stated examples. Features of the laser lift-off method are therefore also disclosed for the device described herein and vice versa.

The laser lift-off method may comprise the steps:
providing the semiconductor layer sequence grown epitaxially on the carrier,
dividing in particular pulsed laser radiation into at least two partial beams, and
superimposing the partial beams in an irradiation plane, in which a major side of the carrier remote from the semiconductor layer sequence is located.

An angle between the at least two partial beams at the irradiation plane is at least 1.0°.

The average roughness of the major surface of the carrier remote from the semiconductor layer sequence may be 0.1 μm to 5.0 μm, in particular 0.25 μm to 2.5 μm. For example, when growing a semiconductor layer sequence epitaxially, a substrate may be used with one polished and one rough surface. This makes it possible to use relatively inexpensive substrates.

In the laser lift-off method, the carrier may comprise sapphire or consist thereof. Alternatively, the carrier may consist of another material transparent to laser radiation. Transparent may mean that the carrier exhibits an absorption of at most 20% or of at most 1%, preferably of at most 0.2% at the wavelength of the laser radiation and partial radiation.

The semiconductor layer sequence may be based on gallium nitride, indium gallium nitride and/or aluminium gallium nitride. It is alternatively possible for a layer to be severed to comprise another, in particular oxide-containing or nitride-containing, material such as silicon nitride, which exhibits high absorption at the wavelength of the laser radiation.

Furthermore, a nitride semiconductor layer sequence is provided, based in particular on gallium nitride. The semiconductor layer sequence is produced for example with a device or with a method as indicated in relation to one or more of the above-stated examples. Features of the semiconductor layer sequence are therefore also disclosed for the method and for the device and vice versa.

In addition to a laser lift-off method, it is also possible for a device described herein and a modification of a method described herein to be used for illumination, homogeneous on a microscopic scale, of a layer through a rough surface, the layer being spaced from the rough surface. For example, it is possible to achieve homogeneous exposure of a photoresist in a lithographic method or homogeneous illumination during radiation-induced curing of a bonding agent, such as a UV-curing adhesive, through rough surfaces.

A laser lift-off method described herein, a semiconductor layer sequence described herein and a device described herein will be explained in greater detail below with reference to the drawings and with the aid of examples. Elements which are the same in the individual figures are indicated with the same reference signs. The relationships between the elements are not shown to scale, however, but rather individual elements may be shown exaggeratedly large to assist in understanding.

FIG. 1 shows an example of a device 100 with which a laser lift-off method is performed. A laser, not shown in FIG. 1, emits pulsed laser radiation L. Two beam splitters 4a, 4b divide the laser radiation into three partial beams P1, P2, P3, partial beam P3 being the laser radiation L reduced by partial beams P1, P2. The partial beams P1, P2, P3 and the laser radiation L for example comprise approximately Gaussian beam profiles with a diameter of $1/e^2$, relative to a drop in the intensity of the radiation in the lateral direction with regard to a maximum intensity, of 2 mm to 8 mm, in particular of around 4 mm. The wavelength is for example around 343 nm or around 355 nm.

The partial beams P1, P2 are superimposed by mirrors 5 with the non-deflected partial radiation P3 in an irradiation plane 10. An angle α1, α2 between the partial beams P1, P3 and P2, P3 amounts in each case to around 30°. The angles α1, α2 are also equal to an angle with a perpendicular 11 to the irradiation plane 10. The perpendicular 11 coincides with a beam axis of the partial radiation P3 and the laser radiation L.

The irradiation plane 10 is set up such that, with a holder not shown in FIG. 1, a carrier 3 with a layer 2 or with a semiconductor layer sequence 2 comes to lie with a major side 30, remote from the layer 2, of the carrier 3 in the irradiation plane 10. The major side 30 of the carrier 3 preferably comprises a roughness of 0.5 µm to 1.5 µm, for example a roughness of roughly 1 µm.

Beam paths of the partial beams P1, P2, P3 differ from one another in length, in each case calculated from the beam splitter 4a to the irradiation plane 10. For example, the beam path of the partial beam P2 is around 15 cm longer than the beam path of the partial beam P3. The beam path of the partial beam P1 is for example around 30 cm longer than the beam path of the partial beam P3. A pulse duration of the laser radiation L is for example around 5 ns, an optical path length difference between the partial beams P1, P3 so corresponding to around 0.2 times the pulse duration. In other words, the pulses of the partial beams P1, P2, P3 impinge at different times on the carrier 3.

Unlike as is shown in FIG. 1, it is possible in particular for the partial beams P2 and P3 to be guided such that the individual pulses of the partial beams P1, P2, P3 reach the irradiation plane 10 substantially at the same time. However, through arrival of the pulses of the partial beams P1, P2, P3 at the irradiation plane 10 at moderately different times, the interference capability of the laser radiation L or the partial beams P1, P2, P3 at the irradiation plane 10 can be reduced.

Figure 2:
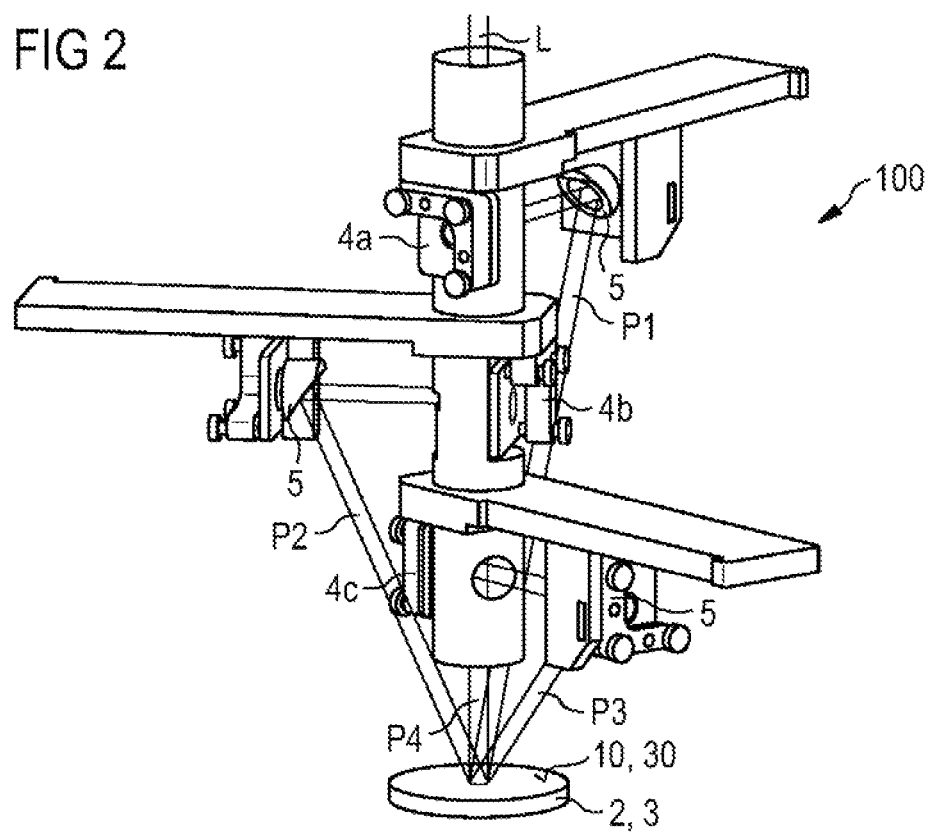

FIG. 2 shows a three-dimensional representation of a further example of the device 100 with which the laser lift-off method may be performed. The laser radiation L is divided into the four partial beams P1, P2, P3, P4. The partial beams P1, P2, P3 are arranged rotationally symmetrically around the non-deflected partial beam P4. The angles at which the partial beams P2, P3, P4 impinge on the major side 30 of the carrier 3 differ from one another, for example in pairs.

Figure 3:
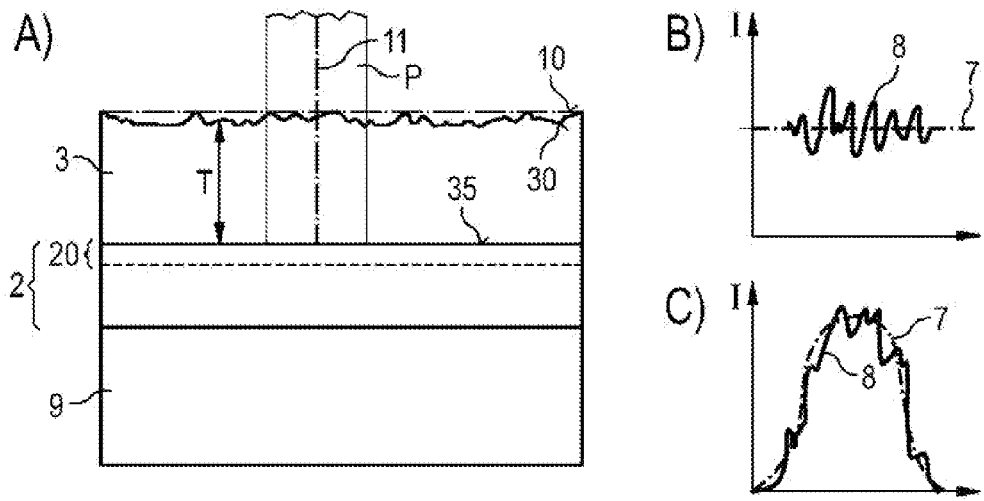
FIGS. 3 and 5 show schematic examples of semiconductor layer sequences described herein.

FIG. 3A shows a sectional representation of the semiconductor component. The semiconductor layer sequence 2, which is preferably grown epitaxially on the carrier 3 is further mounted on a substrate 9 after epitaxial growth. Bonding layers between the substrate 9 and the semiconductor layer sequence 2 are not shown in the figures. The carrier 3 consists for example of sapphire and has a thickness preferably of 250 µm to 1.5 mm, in particular a thickness of around 650 µm.

A decomposition zone 20 of the semiconductor layer sequence 2 at a major side 35 of the carrier 3 facing the substrate 9 absorbs the partial radiation P. The thickness of the semiconductor layer sequence 2 is in total for example at most 12 µm, in particular around 6 µm. As a result of the absorption of the partial radiation P, thermal decomposition of the material of the decomposition zone 20 takes place. By scanning the semiconductor layer sequence 2 and the carrier 3 laterally with the partial beams P1, P2, P3, P4, the semiconductor layer sequence 2 may be severed from the carrier 3. The energy density of all the partial beams P1, P2, P3, P4 per pulse is overall for example around 400 mJ/cm$^2$ and preferably just below a threshold for destruction of a material of the decomposition zone 20.

FIGS. 3B and 3C schematically plot an intensity I of the partial radiation P in a lateral direction. According to FIG. 3B, the partial radiation P comprises a rectangular envelope 7 of an actual beam profile 8 of the partial radiation P and, according to FIG. 3C, the envelope 7 is Gaussian. The actual beam profile 8 deviates from the envelope 7 due to interference effects. These deviations may lead to uneven detachment of the semiconductor layer sequence 2 from the carrier 3 and thus to damage to the semiconductor layer sequence 2. By dividing the laser radiation L into at least two of the partial beams P, the intensity modulations of the actual beam profile 8 around the envelope 7 may be reduced such that the semiconductor layer sequence 2 may be efficiently and reliably detached from the carrier 3 by the device and the method. For example, the deviations of the envelope 7 from the actual beam profile 8 are at most 20%, preferably at most 10%.

The magnitude of the intensity modulation of the actual beam profile 8 relative to the envelope 7 may be detected for example by roughness of the semiconductor layer sequence 2 after severing from the carrier 3. If the decomposition zone 20 is removed from the semiconductor layer sequence 2 for example by etching after severing from the carrier 3, the intensity modulation of the actual beam profile 8 may be detected via a structure of the semiconductor layer sequence 2 resulting from etching on a side remote from the substrate 9.

Figure 4:
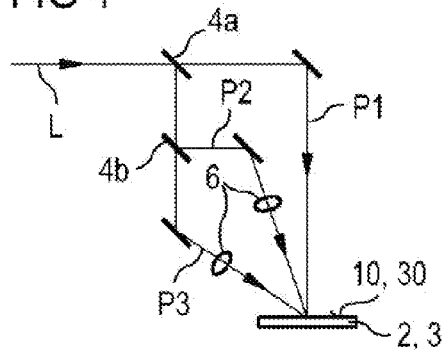

In the example according to FIG. 4, the partial radiation P2, P3 passes in each case through an optical component 6. The optical component 6 is for example a cylinder lens, with which a cross-section of the partial beams P2, P3 in the irradiation plane 10 may be conformed to a cross-section of the partial beam P1 which impinges perpendicularly on the irradiation plane 10, cf. also FIG. 6B. Except for the optical component 6 designed for beam correction, the partial beams P1, P2, P3 preferably in each case do not pass through any further condensed matter downstream of the in each case associated beam splitter 4a, 4b as far as the irradiation plane 10.

Figure 5:
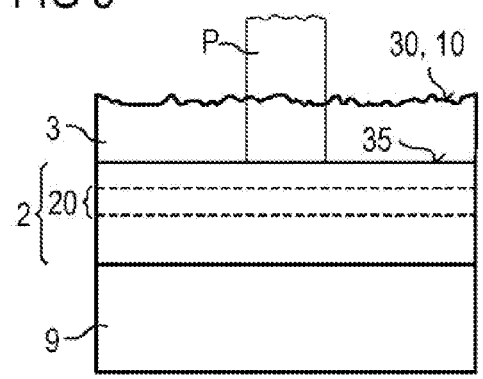

According to FIG. 5, the semiconductor layer sequence 2 does not comprise the decomposition zone 20 directly at the major side 35 of the carrier 3 facing the substrate 9. In other words, it is possible to effect partial lift-off of the semiconductor layer sequence 2 with the method described herein. In contrast thereto, it is alternatively or additionally also possible for the carrier 3 to comprise a partial layer or region, not shown, which exhibits increased absorption for the partial radiation P such that then part of the carrier 3 may also remain on the semiconductor layer sequence 2 after severing.

The semiconductor layer sequence 2 is based for example on gallium nitride. It is likewise possible for the decomposition zone 20 to comprise a different, nitride-containing material. For example, the decomposition zone 20 may consist of or comprise silicon nitride.

Figure 6:
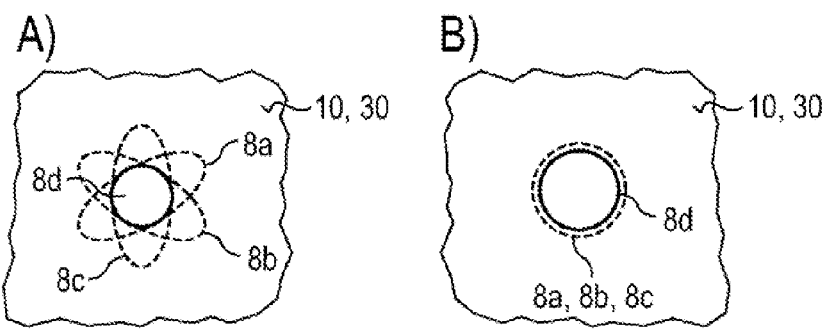
FIG. 6 shows schematic plan views of major sides of a carrier in the case of a laser lift-off method described herein.

FIGS. 6A and 6B show plan views of the irradiation plane 10 and the major side 30. In addition, the beam profiles 8a, 8b, 8c, 8d of the partial beams P1, P2, P3, P4 are shown which are, for example, present in the irradiation plane 10 as a result of the device 100 according to FIG. 2. Because the partial beams P1, P2, P3 impinge on the irradiation plane 10 at a comparatively large angle to the perpendicular 11 of the plane, the partial beams P1, P2, P3 comprise different cross-sections in the irradiation plane 10.

FIG. 6B shows that the cross-sections in the irradiation plane 10 have identical or substantially identical cross-sectional areas and lateral dimensions. This may be achieved by in particular reflective optics, for example by appropriately shaped mirrors 5 or by the optical component 6 in the beam paths of the partial beams P1, P2, P3. Preferably, at least 80% or at least 90% of the total energy of the partial beams P1, P2, P3 lies within a circle with a radius of the average or smallest beam diameter of the partial beams P1, P2, P3, relative to a drop in intensity to $1/e^2$.

Figure 7:
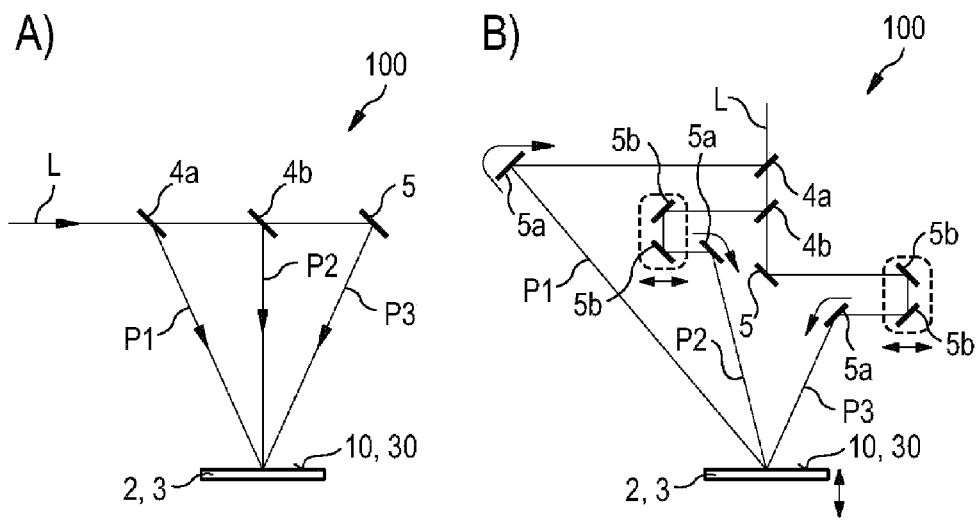

FIGS. 7A and 7B show further examples of the device 100. According to FIG. 7B the three mirrors 5a are rotatable about a horizontal axis such that the angle at which the partial beams P1, P2, P3 impinge on the major side 30 is adjustable. Likewise, the carrier 3 with the semiconductor layer sequence 2 may optionally be displaced vertically. The beam paths of the partial beams P2, P3 are adjustable by the movable mirrors 5b such that a time delay between the partial beams P1, P2, P3 may be established.

Figure 8:
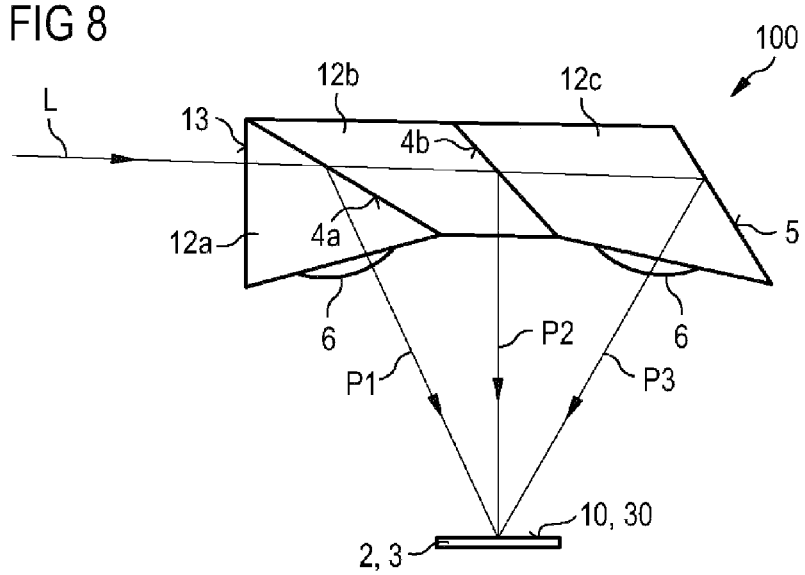

In the example according to FIG. 8, the beam splitters 4a, 4b are implemented in the form of prisms 12a, 12b, 12c formed for example of silica glass. The prisms 12a, 12b, 12c are either cemented together or, preferably, separated from one another by narrow air gaps. The beam splitters 4a, 4b are then partially reflecting boundary faces of the prisms 12a, 12b. The beam splitter 4a exhibits a reflectivity of around 33% and the beam splitter 4b a reflectivity of around 50%. The reflectivity may be adjusted for example by coatings on the corresponding boundary faces of the prisms 12a, 12b, by the angle of the corresponding boundary faces of the prisms 12a, 12b, 12c, by polarization of the radiation and/or by the thickness of a gap between adjacent prisms 12a, 12b, 12c.

The optical components 6, which take the form of cylinder lenses are optionally either mounted on the prisms 12a, 12c or already produced in one piece with the prisms 12a, 12c. It is ensured by the cylinder lenses that the partial beams P1, P2, P3 have identical beam cross-sections in the irradiation plane 10 (see also FIG. 6B). The mirror 5 may be formed by a totally reflecting boundary face of the prism 12c or by a highly reflective coating. The prism 12a preferably comprises an anti-reflective coating 13 on a radiation entrance face. When using femtosecond pulses or picosecond pulses, devices not shown in FIG. 8 may be provided for correcting a colour gradient over time, or chirp, in the pulses of the partial beams P1, P2, P3.

The devices and methods described herein are not restricted by the description given with reference to the examples. Rather, this disclosure encompasses any novel feature and any combination of features, including in particular any combination of features in the appended claims, even if those features or the combination is not itself explicitly indicated in the claims or examples.

The invention claimed is:

1. A device for a laser lift-off method for severing at least one layer from a carrier comprising:
   a laser that generates laser radiation; and
   at least one beam splitter;
   wherein
   the laser radiation is divided into at least two partial beams by the at least one beam splitter,
   the at least two partial beams are superimposed in an irradiation plane,
   the laser radiation is pulsed laser radiation and a pulse duration of the laser radiation is at most 50 ns, and an optical path length difference between the partial beams corresponds to at least 0.025 times and at most 0.25 times the pulse duration,
   the irradiation plane is provided such that a major side of the carrier remote from the layer is arranged therein, and
   an angle between the at least two partial beams at the irradiation plane is at least 1.0°.

2. The device according to claim 1, wherein all the partial beams have the same intensity, with a tolerance of at most 20%.

3. The device according to claim 1, wherein the angle between the partial beams is 7.5° to 50° and an angle between the partial beams and a perpendicular of the irradiation plane is 0° to 50°.

4. The device according to claim 1, wherein, between the associated beam splitter and the irradiation plane, the partial beams do not pass through any optical components provided for radiation transmission.

5. The device according to claim 1, wherein the partial beams each exhibit identical cross-sectional areas and identical lateral dimensions in the irradiation plane with a tolerance of at most 15%.

6. The device according to claim 1, wherein energy density of all the partial beams together in the irradiation plane is 200 mJ/cm$^2$ to 850 mJ/cm$^2$ per pulse.

7. A laser lift-off method for severing an epitaxially grown semiconductor layer sequence from a carrier, comprising:
   providing a semiconductor layer or the semiconductor layer sequence grown epitaxially on the carrier;
   dividing laser radiation into at least two partial beams; and
   superimposing the partial beams in an irradiation plane in which a major side of the carrier remote from the semiconductor layer sequence is located,
   wherein an angle between the at least two partial beams at the irradiation plane is at least 1.0°, the carrier has a thickness of 250 µm to 1.5 µm, and intensity modulation of the superimposed partial beams at a growth side of the carrier facing the semiconductor layer sequence is at most 20%, relative to a local envelope of a beam profile of the superimposed partial beams.

8. The method according to claim 7, wherein an average roughness of a major side of the carrier remote from the semiconductor layer sequence is 0.1 µm to 5.0 µm.

9. The method according to claim 7, wherein the carrier comprises sapphire or consists thereof, and the semiconductor layer sequence is based on GaN, InGaN and/or AlGaN.

10. The method according to claim 7, which is carried out with a device comprising:
a laser that generates laser radiation; and
at least one beam splitter;
wherein
the laser radiation is divided into at least two partial beams by the at least one beam splitter,
the at least two partial beams are superimposed in an irradiation plane,
the irradiation plane is provided such that a major side of the carrier remote from the semiconductor layer is arranged therein, and
an angle between the at least two partial beams at the irradiation plane is at least 1.0°.

11. A laser lift-off method for severing an epitaxially grown semiconductor layer sequence from a carrier, comprising:
providing a semiconductor layer or the semiconductor layer sequence grown epitaxially on the carrier;
dividing laser radiation into at least two partial beams; and
superimposing the partial beams in an irradiation plane in which a major side of the carrier remote from the semiconductor layer sequence is located,
wherein
an angle between the at least two partial beams at the irradiation plane is 7.5° to 50° and an angle between the partial beams and a perpendicular of the irradiation plane is 0° to 30°,
the laser radiation is pulsed laser radiation and a pulse duration of the laser radiation is at most 50 ns,
an optical path length difference between the partial beams corresponds to at least 0.025 times and at most 0.25 times the pulse duration, and
an average roughness of the major side of the carrier remote from the semiconductor layer sequence is 0.1 µm to 5.0 µm.

12. A device for a laser lift-off method for severing at least one layer from a carrier comprising:
a laser that generates laser radiation; and
at least one beam splitter;
wherein
the laser radiation is divided into at least two partial beams by the at least one beam splitter,
the at least two partial beams are superimposed in an irradiation plane,
the irradiation plane is provided such that a major side of the carrier remote from the layer is arranged therein, and
an angle between the at least two partial beams at the irradiation plane is at least 1.0°, and
the laser radiation is divided by N−1 beam splitters into N partial beams according to a reflectivity R(N) of the Nth beam splitter:

$R(N)=1/(N+1)$, wherein N is an integer of 3 to 8, and the beam splitters are arranged with increasing reflectivity along a beam path towards the irradiation plane.

* * * * *